(12) United States Patent
Lee

(10) Patent No.: US 7,203,791 B2
(45) Date of Patent: Apr. 10, 2007

(54) FLASH MEMORY DEVICE WITH PARTIAL COPY-BACK MODE

(75) Inventor: Jin-Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 362 days.

(21) Appl. No.: 10/830,940

(22) Filed: Apr. 22, 2004

(65) Prior Publication Data

US 2004/0221092 A1  Nov. 4, 2004

(30) Foreign Application Priority Data

Apr. 29, 2003  (KR) .................. 10-2003-0027230
Dec. 4, 2003  (KR) .................. 10-2003-0087633

(51) Int. Cl.
G06F 12/12  (2006.01)

(52) U.S. Cl. .............. 711/103; 711/100; 711/101; 711/102; 365/94; 365/129

(58) Field of Classification Search ............ 711/103, 711/100, 101, 102; 365/94, 129
See application file for complete search history.

(56) References Cited

U.S. PATENT DOCUMENTS

| | | | | |
|---|---|---|---|---|
| 7,039,781 B2 * | 5/2006 | Iwata et al. | .................. | 711/165 |
| 2001/0014037 A1 * | 8/2001 | Kim et al. | ............. | 365/185.18 |
| 2001/0021958 A1 * | 9/2001 | Zink et al. | ................... | 711/103 |
| 2001/0050377 A1 * | 12/2001 | Ikehashi et al. | ............. | 257/200 |
| 2002/0126531 A1 * | 9/2002 | Hosono et al. | ......... | 365/185.17 |
| 2003/0133340 A1 * | 7/2003 | Lee | ............................ | 365/200 |

* cited by examiner

Primary Examiner—Stephen C. Elmore
Assistant Examiner—Daniel Kim
(74) Attorney, Agent, or Firm—Marger Johnson & McCollom, P.C.

(57) ABSTRACT

The disclosure is NAND flash memory device with a partial copy-back mode, comprised of a cell array constructed of pages, a page buffer block composed of page buffers storing data in correspondence with the pages, a selection circuit for designating one or more pages to be initialized in the partial copy-back mode, and a control circuit for generating control signals to operate the page buffers and the selection circuit.

23 Claims, 9 Drawing Sheets

FLASH MEMORY DEVICE WITH PARTIAL COPY-BACK MODE

This application relies for priority upon Korean Patent Application No. 2003-0027230 filed on Apr. 29, 2003, and Korean Patent Application No. 2003-0087633 filed on Dec. 4, 2003, the contents of which are herein incorporated by reference in their entirety.

FIELD OF THE INVENTION

The present invention generally relates to nonvolatile flash (or flash EEPROM) memories and their methods of operating and more specifically, to flash memories for reliable partial copy-back operations.

BACKGROUND OF THE INVENTION

Flash memories are commonly applicable to mass storage subsystems for electronic devices employed in mobile communications, game sets, and so on. Such subsystems are usually implemented as either removable memory cards that can be inserted into multiple host systems or as non-movable embedded storage within the host systems. In both implementations, the subsystem includes one or more flash devices and often a subsystem controller.

Flash memories are composed of one or more arrays of transistor cells, each cell capable of non-volatile storage of one or more bits of data. Therefore, flash memories do not require power to retain the data programmed therein. Once programmed however, a cell must be erased before it can be reprogrammed with a new data value. These arrays of cells are partitioned into groups to provide for efficient implementation of read, program and erase functions. The typical flash memory architecture for mass storage arranges large groups of cells into erasable blocks. Each block is further partitioned into one or more addressable sectors that are the basic unit for read and program functions.

Flash memories basically have their own functional operations of reading, writing (or programming), and erasing. Especially, flash memories additionally extend their facilities to practice a page copy operation (or a copy-back operation). The page copy operation is to transcribe data stored in a page assigned to a specific address to another page assigned to another address. During the page copy, data stored in a page (i.e., a source page) of a specific address are transferred to a page buffer and then the data stored in the page buffer are written into another page (i.e., a target page) assigned to another address by means of a programming process without reading the data out of the flash memory. The page copy function eliminates the need to read-out data to be written and to load data to be written from the external source of the flash memory, which is advantageous to enhancing systemic data rates associated with the subsystem controller.

In the meantime, an over-writing function is not available in the flash memory. Thus, data can be written only into a page that is sustained in an erase state. The page to be written with data must be erased prior to a write (or programming) operation. However, as it is usual for an erase time of the flash memory to take several milli-seconds, every erasing step before writing causes a speed performance to be degraded. By that reason, a memory controller manages the flag memory, such that after data of a specific page is transcribed into an erased page, a memory field including the original data is erased by the block (or the sector) in a surplus time during its operational term.

FIG. 1 illustrates the general scheme of a copy-back operation. Referring to FIG. 1, a memory controller 10 supplies control signals CTRL, command signals CMD, and address signals ADDR to a flash memory 20 and exchanges data signals DIO with the flash memory 20. The flash memory 20 includes a cell array 21 for storing the data and a page buffer block 22 for registering the data to be accessible in a copy-back operation.

The cell array 21 is composed of a plurality of pages each formed of memory cells sharing a single wordline. While a single page as a unit for reading and writing data is designed to store 512 B (Bytes) of data normally at present, the storage capacity of the page is being expanded up to 2 KB in the future.

A copy-back operation is divided into an operation of transcribing data from a source page into the page buffer block 22 and an operation of writing the data into a target page D from the page buffer block 22.

When a copy command and an address assigned to the source page S are provided by the memory controller 10, data Unit-K stored in the source page S is copied into the page buffer block 22. When a copy-back command and an address assigned to the target page D are provided by the controller 10, the data Unit-K stored in the page buffer block 22 is transferred to the target page D.

Recently with the trends of managing the unit pages in a consolidated page in order to enhance operational speeds and to reduce chip sizes, a plurality of unit pages are contemporaneously copied into the page buffer block and transferred into the target pages at the same time.

Such a lumped copy-back operation may be practicable when the memory controller 10 can manage the data (e.g., Unit K-3 through Unit K) stored in a plurality of unit pages at the same time. However, if the memory controller 10 is configured to manage the unit page only, it may cause an unnecessary copy-back result for a unit page that is not to be copied.

For instance, although a part of unit pages data stored in the page buffer block is in need of being copied, it results in effecting an entire copying-back for other data of the other unit pages which are not to be copied while sharing a wordline with the partial unit pages.

As the conventional memory controllers have been still designed to manage the data in the unit of 512 bytes although a unit page of flash memories is being enlarged up to 2K bytes over the 512 bytes, it needs to consider more efficient copy-back features.

SUMMARY OF THE INVENTION

Exemplary embodiments of the present invention provide a flash memory device comprising: a cell array composed of pages including source and target pages; page buffers for storing data of the source page; and means configured to selectively initiate the page buffers during a copy-back operation.

Each of the pages is divided into unit pages. The page buffers each correspond to the unit pages.

In exemplary embodiments of the present invention, a flash memory device comprises: a cell array composed of unit pages; page buffers corresponding to the unit pages; a selection circuit for partially initiating the page buffers; and a control circuit for generating signals to control the page buffers and the selection circuit.

The page buffer includes a latch for storing data, and a reset circuit for initiating the latch. The reset circuit initializes the latch in response to a signal generated from the selection circuit.

The control circuit comprises: a page controller for generating signals to control the page buffers; and an input circuit for generating signals forwarded to the selection circuit. The page controller generates a signal to initialize in accordance with an operational mode. The initializing signal controls signals generated from the selection circuit.

The input circuit comprises: a first input buffer for generating a first control signal in response to first and second command signals; and means configured to generate an address decoding signal in response to an address input after the first command signal. The means comprises: a second input buffer for generating an internal address in response to a column address to differentiating the unit pages; and a decoder for generating the address decoding signal from the internal address.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

A more complete understanding of the present invention may be had by reference to the following description when taken in conjunction with the accompanying drawings in which.

DESCRIPTION OF THE PREFERRED EMBODIMENT

Figure 1:
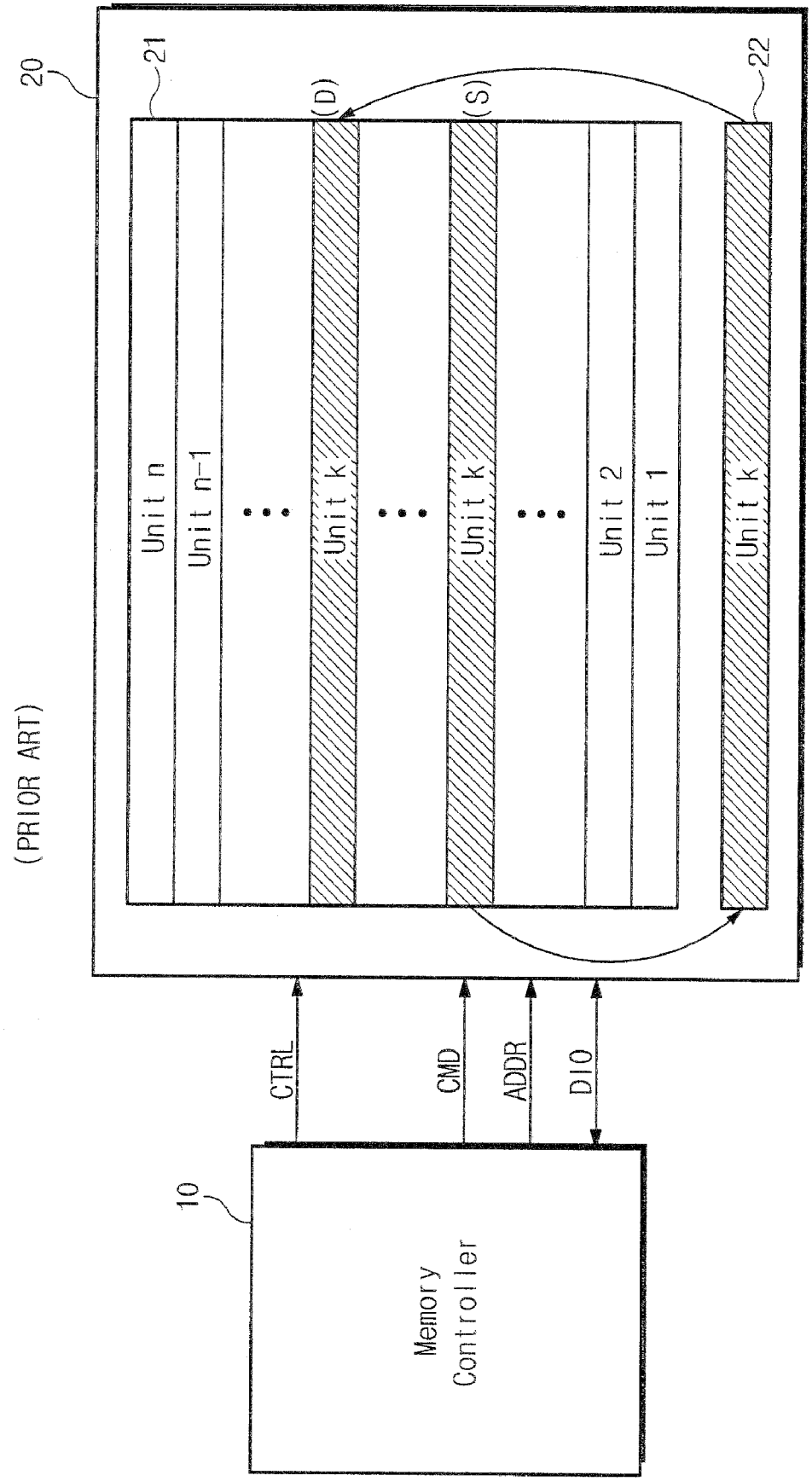
FIG. 1 is an illustration of a typical copy-back operation.

The numerous innovative teachings of the present application will be described with particular reference to presently preferred exemplary embodiments. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Referring now to the drawings wherein like or similar elements are designated with identical reference numerals throughout the several views and wherein various elements depicted are not necessarily drawn to scale.

Figure 2:
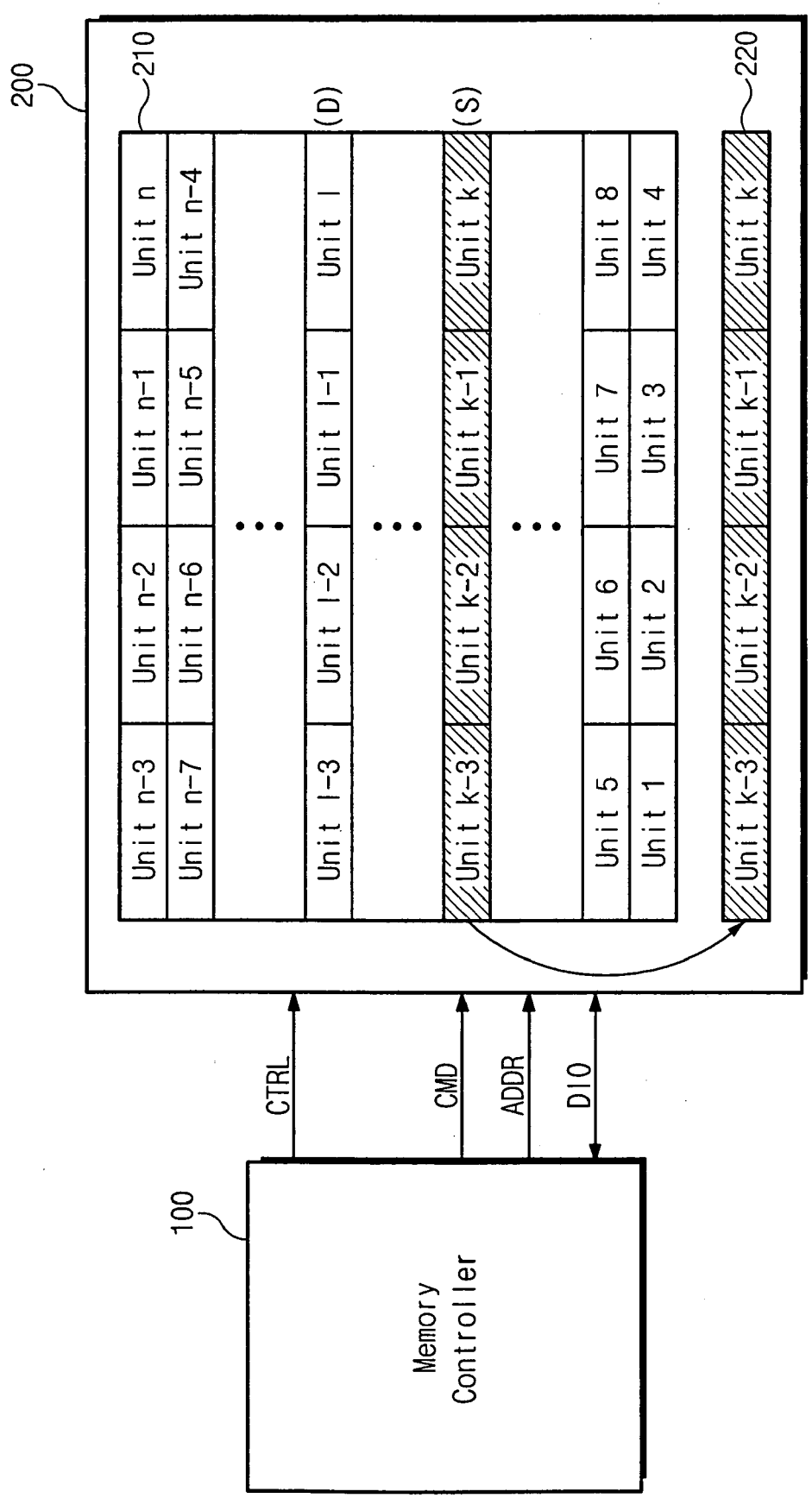
FIG. 2 is an illustration of a read operation according to the present invention.

FIG. 2 illustrates a feature of reading, copying from a source page to a page buffer, according to the present invention. Referring to FIG. 2, a memory controller 100 supplies control signals CTRL, command signals CMD, and address signals ADDR to a flash memory 200, as well as exchanging data signals DIO with the flash memory 200. The flash memory 200 includes a cell array 210 for storing the data and a page buffer block 220 for registering the data to be accessible in a copy-back operation.

The cell array 210 is composed of a plurality of pages each formed of memory cells sharing a single wordline. The pages may include a source page S and a target page D. Especially, each page applicable to the present invention is composed of a plurality of unit pages, such as the source page S being of four units Unit K-3~Unit K. A read or write operation is carried out by the unit page.

The page buffer block 220 temporarily stores data of the source page S during a copy-back operation. The data held in the page buffer block 220 is transferred to the target page D by the copy-back operation.

Once a copy command and an address assigned to the source page S are provided by the memory controller 100, the data stored in the source page S, Unit K-3~Unit K, are copied into the page buffer block 220.

Figure 3:
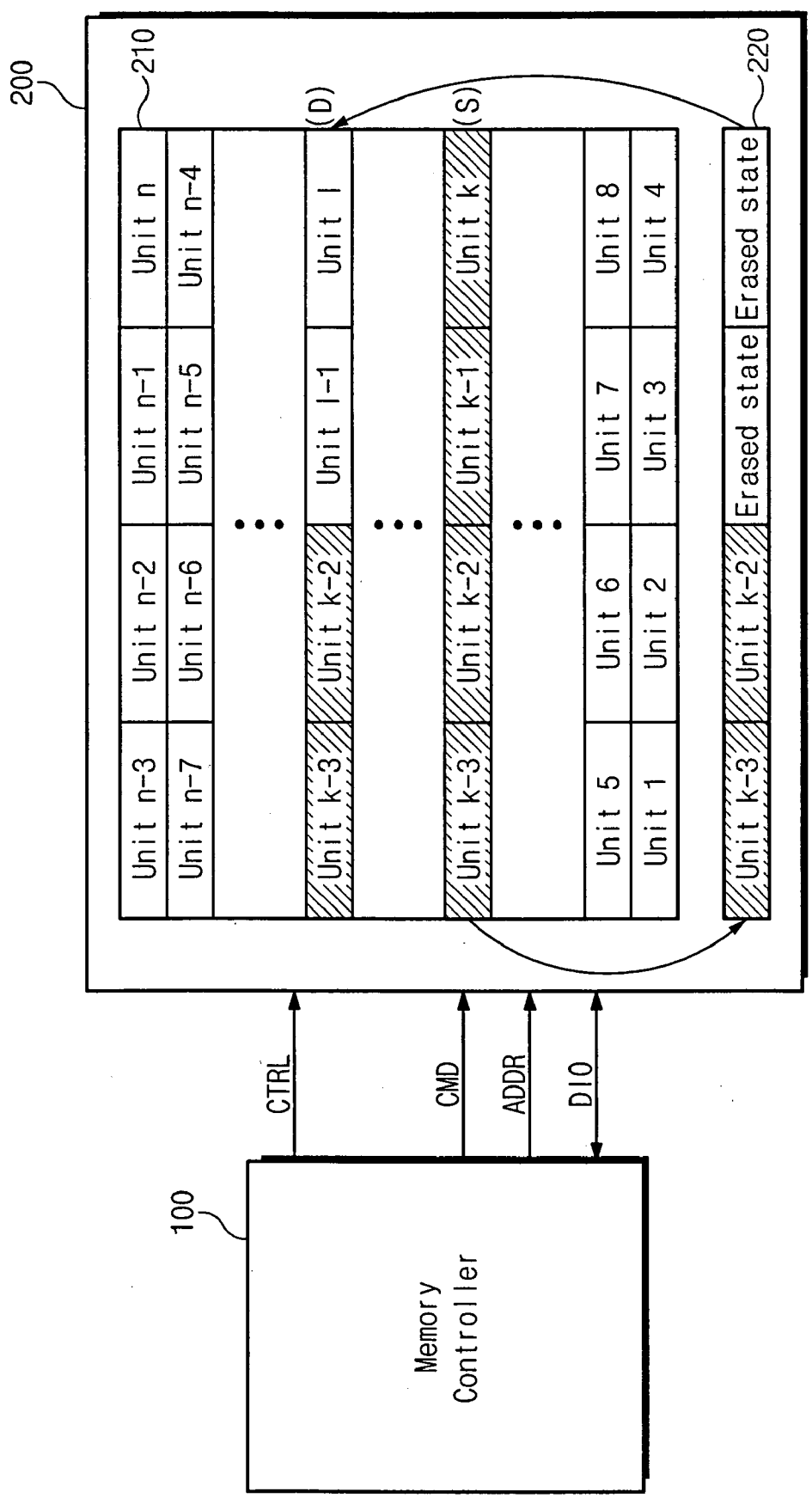
FIG. 3 is an illustration of a partial copy-back operation according to the present invention.

FIG. 3 illustrates the feature of a copy-back operation, or a partial copy-back, according to the present invention. The partial copy-back operation by the present invention precedes an initialization for the data (e.g., Unit K-1 and Unit K), among the copied data such as Unit K-3~Unit K) of the page buffer block 220, which are not to be copied-back, before beginning a copy-back towards the target page D from the page buffer block 220. Therefore, the data of the source page S are partially copied back to the target page D, for example the copy-back data being not Unit K-1 and Unit K but Unit K-3 and Unit K-2.

After completing the initialization, such as deleting or erasing the irrelevant data Unit K-1 and Unit K in the page buffer block 220, a copy-back command and an address assigned to the target page D are introduced from the memory controller 100. The number of supplies of the copy-back command and target page address determines the number of unit pages to be put into the copy-back operation.

Figure 4:
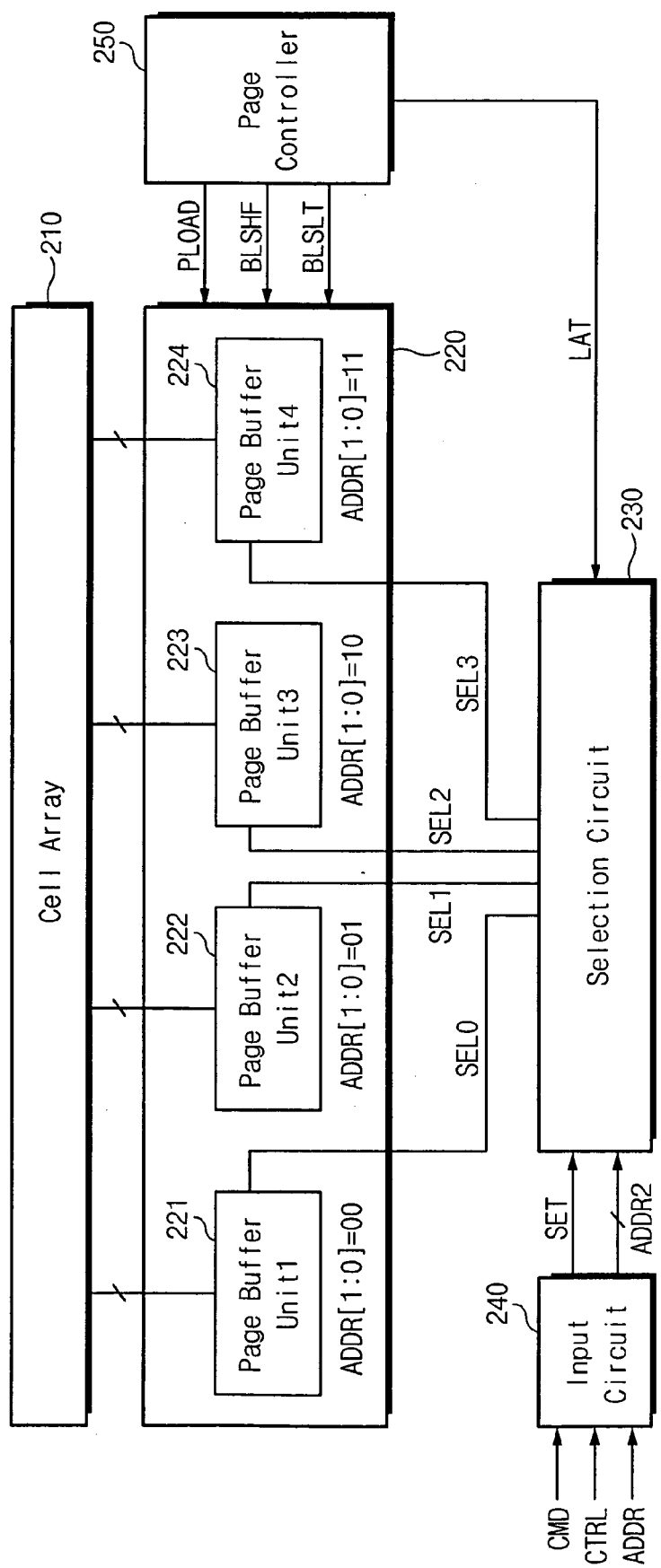
FIG. 4 is a block diagram of a flash memory device with the partial copy-back operation according to the present invention.

FIG. 4 illustrates a functional structure of a flash memory 200 for the partial copy-back operation according to the present invention. Referring to FIG. 4, the flash memory 200 is comprised of a selection circuit 230 for differentiating data groups to be copied back and to be initialized, an input circuit 240 for driving signals operable in the selection circuit 230, and a page controller 250 for controlling the page buffer blocks, in addition to the cell array 210 and the page buffer block 220.

In the cell array 210 composed of a plurality of pages as shown in FIG. 2 or 3, each page of four unit pages has the storage capacity of 2 KB as a whole and each unit page corresponds to the 512-byte capacity.

The page buffer block 220 is divided into a plurality of page buffers 221~224 each corresponding to each unit page. A single page buffer such as 221 is comprised of a latch for storing a data bit and a reset circuit for initializing the latch, which will be more described in conjunction with FIG. 5 later.

The page controller 250 generates control signals PLOAD, BLSHF, and BLSLT to the page buffer block 220 and generates a control signal LAT to the selection circuit 230. The operations with the control signals from the page controller 250 will be described in FIG. 10 later.

The selection circuit 230 applies selection signals SEL0~SEL3 each for the page buffers 221~224. Each selection signal determines whether or not a data bit loaded in its corresponding page buffer is to be selected in the sequence of the copy-back. An exemplary circuit structure and operation will be described with reference to FIG. 6.

The input circuit 240 receives a command signal CMD, such as either the copy command or the copy-back command, a control signal CTRL, and an address signal ADDR and applies a set signal SET and an address decoding signal ADDR2 to the selection circuit 230. The address signal ADDR is converted into an internal address signal ADDR1 of two bits as an example, i.e., ADDR1[1:0], which will be shown in FIG. 7. An exemplary circuit structure and operation will be described with reference to FIG. 6.

Figure 5:
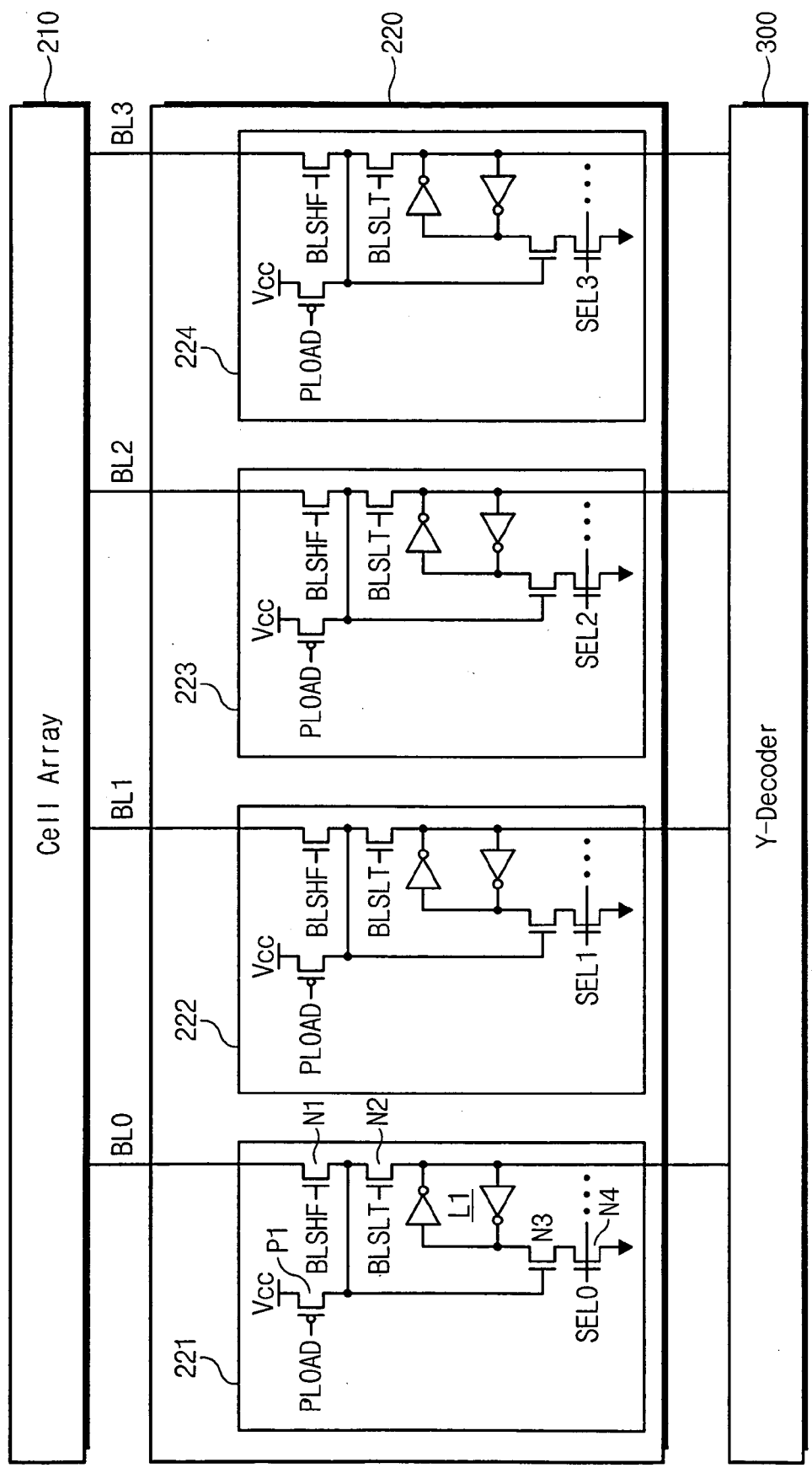
FIG. 5 is a circuit diagram of a page buffer block shown in FIG. 4.

FIG. 5 illustrates internal circuit structures of the page buffers included in the page buffer block 220 shown in FIG. 4, in which four page buffers 221~224 corresponding to the four unit pages are arranged with being connected to their respective bitlines BL0~BL3. It shall be understood by those skilled in the art that more page buffers are disposed in considering a practical page size such as 2 KB in a flash memory device.

Each page buffer includes a PMOS precharge transistor P1 with a gate coupled to the precharge (or pre-loading) signal PLOAD, an NMOS transistors N1 to connect the corresponding bitline to the page buffer, a latch L1 storing the corresponding page data bit, and a reset circuit of NMOS transistors N2, N3 and N4.

A data bit of the latch L1 is initialized when the precharge signal PLOAD is a low level and the selection signal (e.g., SEL0) is a high level. By such initialization, the corresponding data bit is reset to retain its previous one without being written in the target page D. Otherwise, if the selection signal (e.g., SEL0) is a low level, the NMOS transistor N4 is turned off to make the latch L1 maintain its data bit copied from the source page S. The copied data bit held in the latch of the page buffer will be forwarded to the target page D during the subsequent copy-back operation.

As a result, it can be seen that the data retention and conversion is determined by the selection signal (e.g., SEL0, . . . , or SEL3) in correspondence with which unit page is to be copied back into the target page D.

Figure 6:
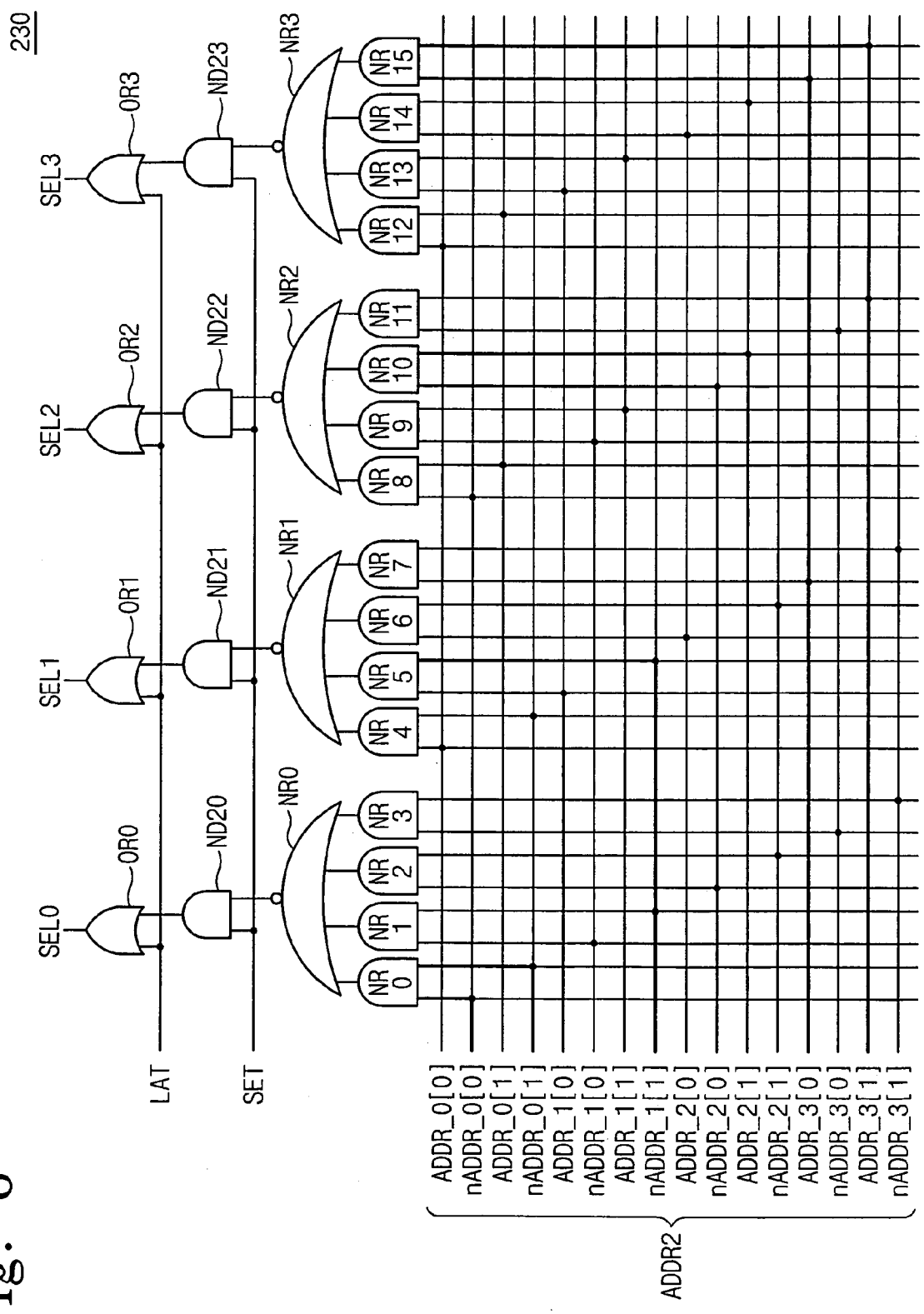
FIG. 6 a diagram of a selection circuit shown in FIG. 4.

FIG. 6 illustrates an exemplary one of the selection circuit 230 shown in FIG. 4. Referring to FIG. 6, the selection circuit 230 is constructed of a gate logic array generating the selection signals SEL~SEL3 from the address decoding signal ADDR2, which are supplied from the input circuit 240, in response to the control signals LAT and SET those are provided from the page controller 250.

The control signal LAT resets all the page buffers 221~224 by forcing the selection signals SEL0~SEL3 to be high levels through OR gates OR0~OR3. The control signal SET, as shown in FIG. 8, is activated with a high level when a program command signal CMD2 is enabled during an activation of a partial copy-back command signal CMD1. When the control signal SET is inactive with a low level, AND gates ND20~ND23 are disabled. Outputs of the AND gates ND20~ND23 are applied to the OR gates OR0~OR3, respectively. The generation of the address decoding signal ADDR2 will be described in more detail with reference to FIGS. 7 and 9 later.

The address decoding signal ADDR2 is composed of 16 bits, ADDR_0[0]~nADDR_3[1], arranged by binary combinations from the internal address signal ADDR[1:0]. The 16 address decoding bits are applied to 16 AND gates ND0~ND15 by two bits paired by the binary combination.

Outputs of the AND gates ND0~ND15 are applied to 4-input NOR gates NR0~NR3 each by four. Outputs of the NOR gates NR0~NR3 are applied each to the AND gates ND20~ND23.

In the condition of that the control signals LAT is inactive with a low level but the control signal SET is active with a high level, when the internal address signal ADDR1[1:0] is "00", nADDR_0[0] and nADDR-0[1] become high levels and thereby the selection signal SEL0 goes to a low level while other selection signal SE11~SEL3 are set to high levels. As like, the coding patterns of the internal address signal ADDR[1:0] determines the optional pattern among the among the selection signals SEL0~SEL3 for the initialization of the page buffers. That is, ADDR1[1:0] of "01" makes SEL1 be a low level, ADDR1[1:0] of "10" makes SEL2 be a low level, and ADDR1[1:0] of "11" makes SEL3 be a low level.

Therefore, if it is predetermined that the page buffers 223 and 224 are to be initialized, their corresponding selection signals SEL2 and SEL3 are established with high levels while the selection signals SEL0 and SEL1 are set to low levels.

Figure 7:
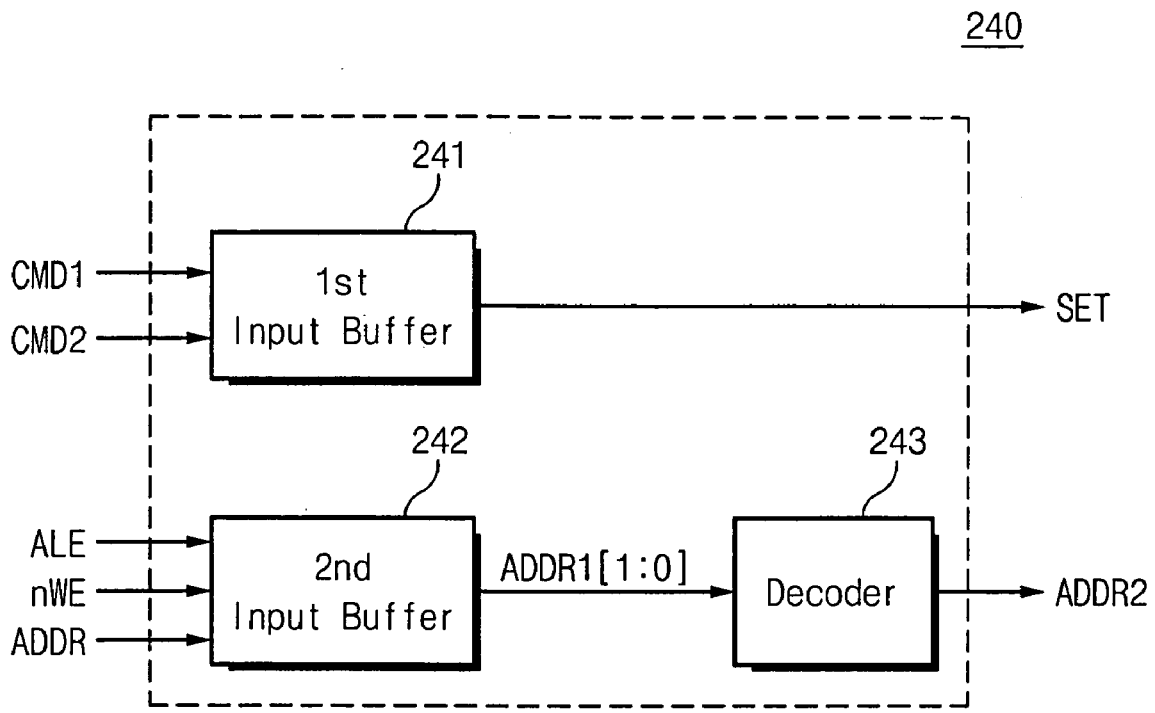
FIG. 7 is a diagram of an input circuit shown in FIG. 4.
Figure 8:
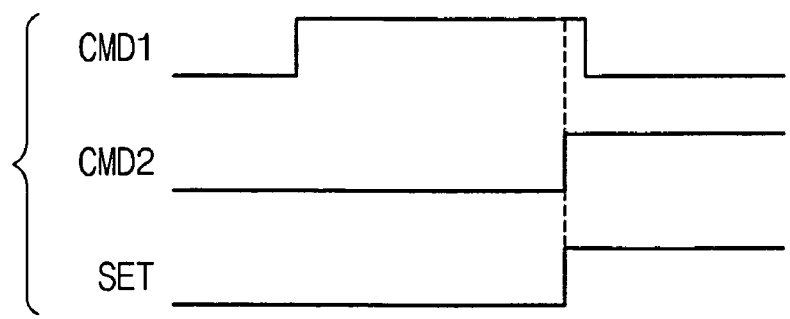
FIG. 8 is a timing diagram of an output signal from a first input buffer of FIG. 7.

FIG. 7 illustrates a functional structure of the input circuit 240 shown in FIG. 4. The input circuit 240 is formed of a first input buffer 241 for generating the control signal SET in sync with the partial copy-back command signal CMD1 and the program command signal CMD2, a second input buffer 242 for generating the internal address signal ADDR1[1:0] in response to the external address signal ADDR that is input to the memory after the issue of the partial copy-back command signal CMD1, and a decoder 243 for generating the 16-bit address decoding signal ADDR2 from the 2-bit internal address signal ADDR[1:0].

The control signal SET is active when the command signals CMD1 and CMD2 are laid on high levels at the same time, being applied to the selection circuit 230 during the partial copy-back operation.

Figure 9:
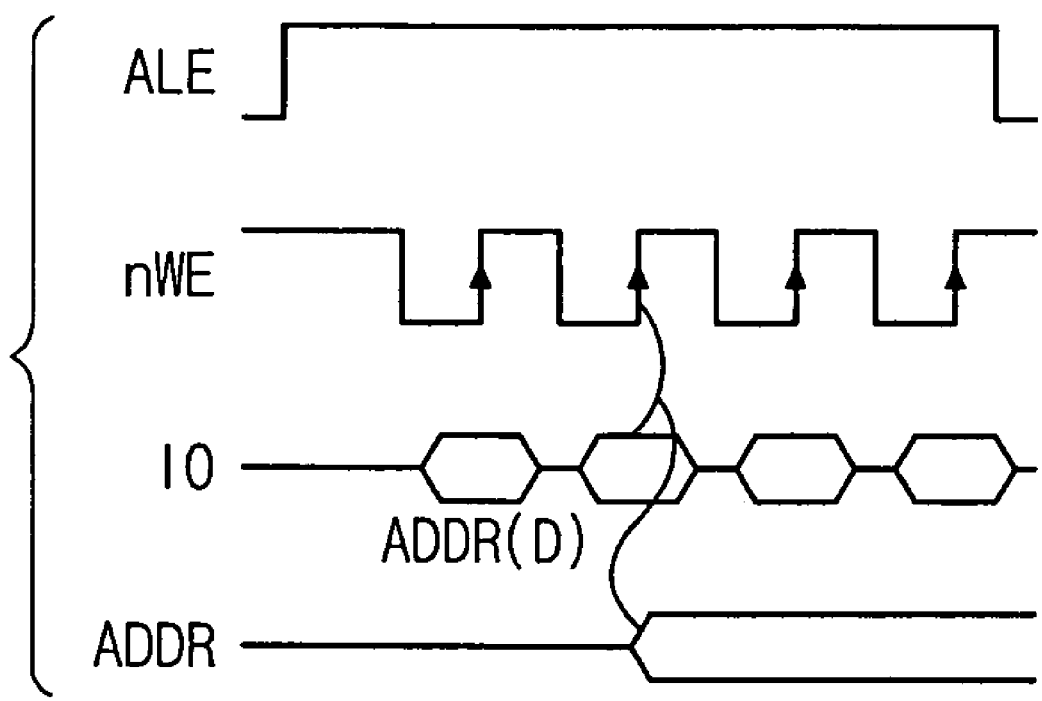
FIG. 9 is a timing diagram of an output signal from a second input buffer of FIG. 7.

The internal address signal ADDR1[1:0] converted from the external address signal ADDR is involved in an address of the target page D, i.e., ADDR(D), and as shown in FIG. 9, generated in accordance with rising edges of the write enable signal new that is oscillating four times while the address latch enable signal ALE is being active. The write enable signal new and the address latch enable signal ALE are provided from the memory controller 100. As it is assumed that a single page is composed of four unit pages as shown in FIG. 2 or 3, the bit number of the internal address signal ADDR1[1:0] is two.

While generating the internal address signal ADDR1[1:0] in the four cycles of the write enable signals nWE, a column address is set in the first and second cycles and a row address is set in the third and fourth cycles. The column address of the first and second cycles contains portions for designating main and spare fields, a unit page, and bitlines, belonging to the target page D.

The 2-bit internal address signal ADDR1[1:0] is converted into the 16-bit address decoding signal ADDR2 by the decoder 243. The address decoding signal ADDR2 is then applied to the selection circuit 230 to generate the selection signals SEL0~SE13 as aforementioned with FIG. 6.

Figure 10:
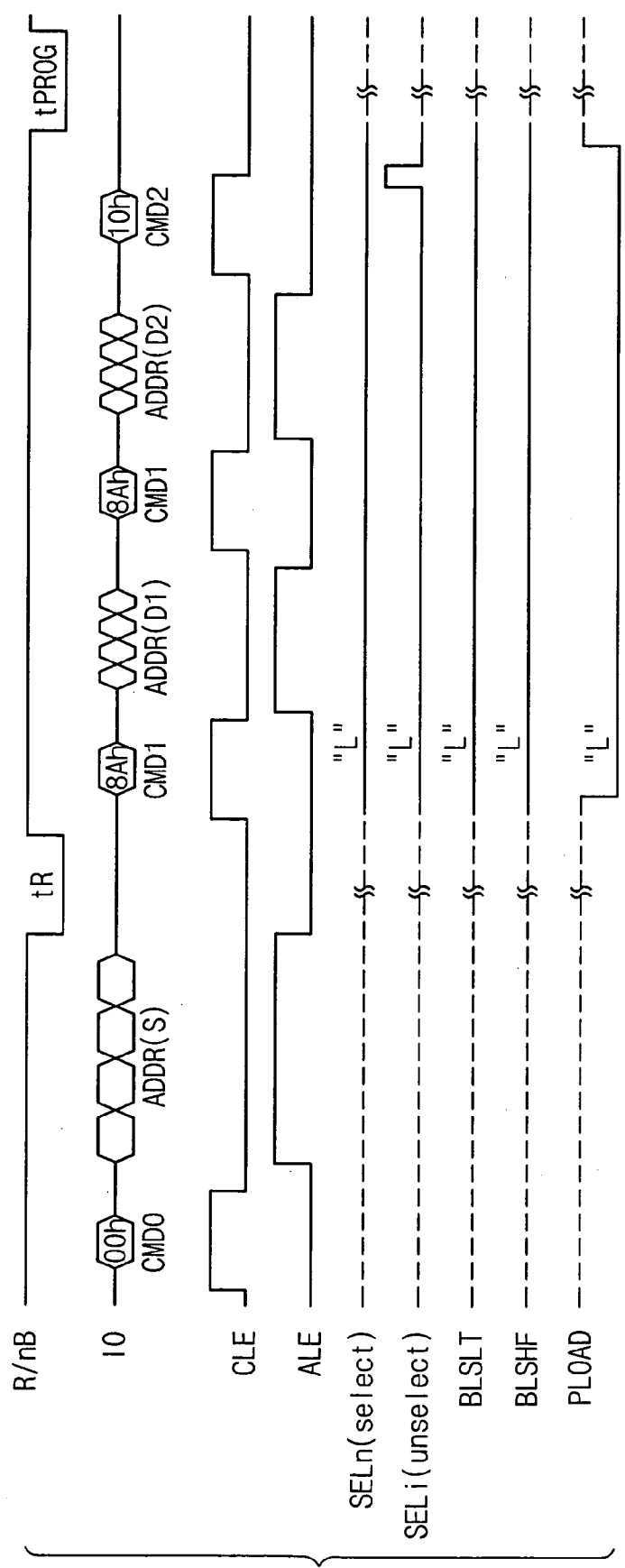
FIG. 10 is an overall timing diagram of the partial copy-back operation according to the present invention.

FIG. 10 shows an overall timing diagram of the partial copy-back operation according to the present invention. The flash memory in this embodiment inputs address signals, data signals, and command signals through input/output pins IO in common.

Referring to FIG. 10, an operation for reading the source page S is first carried out when the copy command CMD0 (00h) is input by an activation of a command latch enable signal CLE. After the input of the copy command signal CMD0, an address ADDR(S) (i.e., the external address) assigned to the source page S is introduced in response to an activation of the address latch enable signal ALE. The source page address ADDR(S) designates the low and columns of the source page S. Completing the input of the source page address ADDR(S), a page copy operation from the source page S to the page buffer block 230 is carried out during a ready/busy signal R/nB is being a low level.

Next, it performs the initialization for data of the unit page not to be copied back. As stated above, when the internal address ADDR1[1:0] originated from the external source page address ADDR(s) is set to "00", "01", "10", and "11", the respective selection signals inactive are SEL0, SEL1, SEL2, and SEL3, respectively. As shown in FIG. 10, if the n'th selection signal SELn is generated with a low level, another selection signal SELi is generated with a high level to initialize its corresponding page buffer. In more practical feature, assuming that the unit pages Unit k-3 and Unit k-2 are to be copied back, the selection signals SEL0, SEL1, SEL2, and SEL3 are generated with low, low, high, and high levels, respectively, from the selection circuit 230. Thereby, the page buffers 221 and 222 retain their copied data while the page buffers 223 and 224 are initialized.

After completing the initialization for the page buffers corresponding to the unit pages not to be copied back, the copy-back command signal CMD1 (8Ah) are input by an activation of the command latch enable signal CLE. Thereafter, a first address ADDR(D1) (i.e., the external address) assigned to the first target page D1 is input by an activation of the address latch enable signal ALE. The first target page address ADDR(D1) designates the low and columns of the first target page D1. Next, a second address ADDR(D2) assigned to the second target page D2 is further input after the second incoming of the copy-back command signal CMD1. The cycles of the inputs with the copy-back command signal CMD1 and the target page address are iterative in accordance with the number of the target pages to be copied back. In this embodiment, the number of the target pages is 2, i.e., D1 and D2.

Once all of the target page addresses are input, a write (or programming) operation begins by an income of the program command signal CMD2 (10h). After the program command signal CMD2 is introduced thereto, the data held in the corresponding page buffers (e.g., 221 and 223) are contemporaneously written into the predetermined target pages D1 and D2 during a period tPROG where the ready/busy signal is being a low level. As a result, the unit pages Unit K-3 and Unit K-2 as the partial pages of the source page S are transcribed into the target pages D1 and D2.

Here, the column address of the source page address is set to be as DON'T-CARE, so that the unit pages to be copied back and not are differentiated.

As described above, as it is possible to conduct the copy-back operation by the partial unit pages, the present invention offers the efficiency of page management without modifying the memory controller associated with unit pages.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A flash memory device comprising:
a cell array composed of pages including source and target pages;
a page buffer block that includes space for a page comprised of a plurality of unit pages for storing data of the source page; and
means configured to selectively initiate at least one unit page of the page buffer block prior to writing at least one different unit page of the page buffer block to a unit page of the target page during a copy-back operation.

2. A flash memory device comprising:
a cell array composed of pages subdivided into unit pages;
page buffers corresponding to the unit pages;
a selection circuit for partially initiating the page buffers; and
a control circuit for generating signals to control the page buffers and the selection circuit.

3. The flash memory device of claim 2, wherein the unit page is a unit for reading and writing.

4. The flash memory device of claim 2, wherein the page buffer includes a latch for storing data, and a reset circuit for initiating the latch during a copy-back operation.

5. The flash memory device of claim 4, wherein the reset circuit initializes the latch in response to a signal generated from the selection circuit.

6. The flash memory device of claim 4, wherein the reset circuit includes an NMOS transistor.

7. The flash memory device of claim 2, wherein the control circuit comprises: a page controller for generating signals to control the page buffers; and an input circuit for generating signals forwarded to the selection circuit.

8. The flash memory device of claim 7, wherein the page controller generates a signal to initialize in accordance with a copy-back mode.

9. The flash memory device of claim 8, wherein the initializing signal controls signals generated from the selection circuit.

10. The flash memory device of claim 7, wherein the input circuit comprises:
a first input buffer for generating a first control signal in response to first and second command signals; and
means configured to generate an address decoding signal in response to an address input after the first command signal.

11. The flash memory device of claim 10, wherein the means comprises:
a second input buffer for generating an internal address of two bits in response to a column address to differentiating the unit pages; and
a decoder for generating the address decoding signal from the internal address.

12. The flash memory device of claim 11, wherein the internal address is generated in sync with a write enable signal.

13. A flash memory device comprising:
a cell array composed of unit pages;
page buffers corresponding to the unit pages, each including a latch for storing data and a reset circuit for initiating the latch;
a page controller for generating signals to control the page buffers;
a selection circuit for selectively initiating the page buffers by enabling the reset circuits of the selected page buffers during a copy-back operation; and
an input circuit for generating signals to control the selection circuit during the copy-back operation.

14. The flash memory device of claim 13, wherein the unit page is a unit for reading and writing.

15. The flash memory device of claim 13, wherein the reset circuit includes an NMOS transistor.

16. The flash memory device of claim 13, wherein the page controller generates a signal to initialize in accordance with an operational mode.

17. The flash memory device of claim 16, wherein the initializing signal controls signals generated from the selection circuit.

18. The flash memory device of claim 13, wherein the input circuit comprises:
   a first input buffer for generating a first control signal in response to first and second command signals; and
   means configured to generate an address decoding signal in response to an address input after the first command signal.

19. The flash memory device of claim 18, wherein the means comprises:
   a second input buffer for generating an internal address of two bits in response to a column address to differentiating the unit pages; and
   a decoder for generating the address decoding signal from the internal address.

20. The flash memory device of claim 19, wherein the internal address is generated in sync with a write enable signal.

21. A method of addressing a memory, comprising:
   identifying a source page;
   writing a page of data from a source page of a memory cell array to a page buffer block comprised of a plurality of unit pages;
   identifying a target page of the memory cell array; and
   writing a unit page from the page buffer block to a unit page of the target page.

22. The method of claim 21, wherein the size of a unit page is less than the size of a page.

23. The method of claim 22, wherein the unit page is 512 bytes and the page is 2K bytes.

* * * * *

UNITED STATES PATENT AND TRADEMARK OFFICE
CERTIFICATE OF CORRECTION

PATENT NO. : 7,203,791 B2  Page 1 of 1
APPLICATION NO. : 10/830940
DATED : April 10, 2007
INVENTOR(S) : Jin-Yub Lee It is certified that error appears in the above-identified patent and that said Letters Patent is hereby corrected as shown below:

Column 5, line 47, the words "SEL~SEL3" should read -- SEL0~SEL3 --;
Column 6, line 10, the words "SE11~SEL3" should read -- SEL1~SEL3 --;
Column 6, line 61, the words "SEL0~SE13" should read -- SEL0~SEL3 --.

Signed and Sealed this

Nineteenth Day of January, 2010

David J. Kappos
*Director of the United States Patent and Trademark Office*